(12) United States Patent
Simmons

(10) Patent No.: US 6,587,917 B2
(45) Date of Patent: Jul. 1, 2003

(54) MEMORY ARCHITECTURE FOR SUPPORTING CONCURRENT ACCESS OF DIFFERENT TYPES

(75) Inventor: Laura Elisabeth Simmons, Corvallis, OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 32 days.

(21) Appl. No.: 09/870,361

(22) Filed: May 29, 2001

(65) Prior Publication Data

US 2002/0184437 A1 Dec. 5, 2002

(51) Int. Cl.[7] .............................. G06F 12/00

(52) U.S. Cl. .................. 711/105; 711/150; 711/168; 365/189.04

(58) Field of Search ................. 711/105, 140, 711/150, 168; 365/189.04, 63, 230.03

(56) References Cited

U.S. PATENT DOCUMENTS

| | | | | |
|---|---|---|---|---|
| 3,643,236 A | * | 2/1972 | Kolankowsky et al. | 365/49 |
| 4,875,196 A | * | 10/1989 | Spaderna et al. | 365/238 |
| 5,276,642 A | * | 1/1994 | Lee | 365/189.04 |
| 5,367,494 A | * | 11/1994 | Shebanow et al. | 365/230.03 |
| 5,864,505 A | * | 1/1999 | Higuchi | 365/189.04 |
| 6,157,560 A | * | 12/2000 | Zheng | 365/63 |
| 6,377,492 B1 | * | 4/2002 | Rong et al. | 365/189.02 |

* cited by examiner

*Primary Examiner*—Hiep T. Nguyen
*Assistant Examiner*—Nasser Moazzami

(57) ABSTRACT

A memory architecture for supporting mixed-mode memory accesses. A common row address is provided. A first column address for accessing a first column and a second column address for accessing a second column are provided. A first write control signal for specifying one of a write access and a read access for the first column, and a second write control signal for specifying one of a write access and a read access for the second column are also provided. The memory architecture, responsive to these input signals, supports concurrent mixed-mode memory accesses to the first column and a write access to the second column.

14 Claims, 5 Drawing Sheets

| ADDRESS | COLUMN 0 | COLUMN 2 | COLUMN 3 |
| --- | --- | --- | --- |
| 0 | B1 DATA 0 | TRASH | TRASH |
| 1 | B1 DATA 1 | B2 DATA 1 | TRASH |
| 2 | B1 DATA 2 | B2 DATA 2 | B3 DATA 1 |
| 3 | B1 DATA 3 | B2 DATA 3 | B3 DATA 2 |
| ⋮ | ⋮ | ⋮ | ⋮ |
| N | B1 DATA N | B2 DATA N-1 | B3 DATA N-2 |
| N + 1 | TRASH | B2 DATA N | B3 DATA N-1 |
| N + 2 | TRASH | TRASH | B3 DATA N |

US 6,587,917 B2

MEMORY ARCHITECTURE FOR SUPPORTING CONCURRENT ACCESS OF DIFFERENT TYPES

FIELD OF THE INVENTION

The present invention relates generally to memory circuits, and more particularly, to a memory architecture for supporting concurrent access of different types.

BACKGROUND OF THE INVENTION

A typical embedded dynamic random access memory (DRAM) has a data width of 128 bits, which is divided into four 32-bit words. Consider the case, where there are four blocks (e.g., BLOCK0, BLOCK1, BLOCK2, BLOCK3) that access this memory. The blocks use the same row space but different column spaces for memory access. FIG. 1 illustrates a prior art memory configuration.

This memory architecture allows for concurrent access to all four columns when the access type is the same (i.e., when the operation for all four columns is all a read operation or when all the operation for all four columns is all a write operation). This restriction is referred to as an access-type restriction (i.e., only common access types can be performed concurrently).

Unfortunately, the access-type restriction incurs a significant time penalty. For example, when three of the four columns are of access type one and the fourth column is of access type two, two separate accesses or transfers are required. In other words, columns with different access types cannot be accessed concurrently, but instead must be performed in sequential order. As can be appreciated, the access-type restriction undesirably increases the time for memory accesses.

An example of a memory configuration that has this access-type restriction is the CMOS synchronous SRAM model TC59SM816 available from Toshiba, Inc.

Consequently, it would be desirable for a memory architecture that allows for supporting concurrent memory access of different types.

Based on the foregoing, there remains a need for a memory architecture for supporting concurrent access of different types.

SUMMARY OF THE INVENTION

According to one embodiment of the present invention, a memory architecture for supporting mixed-mode memory accesses. A common row address is provided. A first column address for accessing a first column and a second column address for accessing a second column are provided. A first write control signal for specifying one of a write access and a read access for the first column, and a second write control signal for specifying one of a write access and a read access for the second column are also provided. The memory architecture, responsive to these input signals, supports concurrent mixed-mode memory accesses to the first column and a write access to the second column.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

A memory architecture for supporting mixed-mode memory access is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

An individual write enable control signal is provided for each column. For example, when there are four columns (e.g., column_0, column_1, column_2, and column_3), there are four write enable control signals, where there is one write enable control signal corresponding to each column.

The memory architecture of the present invention removes the access-type restriction and allows concurrent mixed-mode memory accesses.

Memory Architecture

Figure 1:
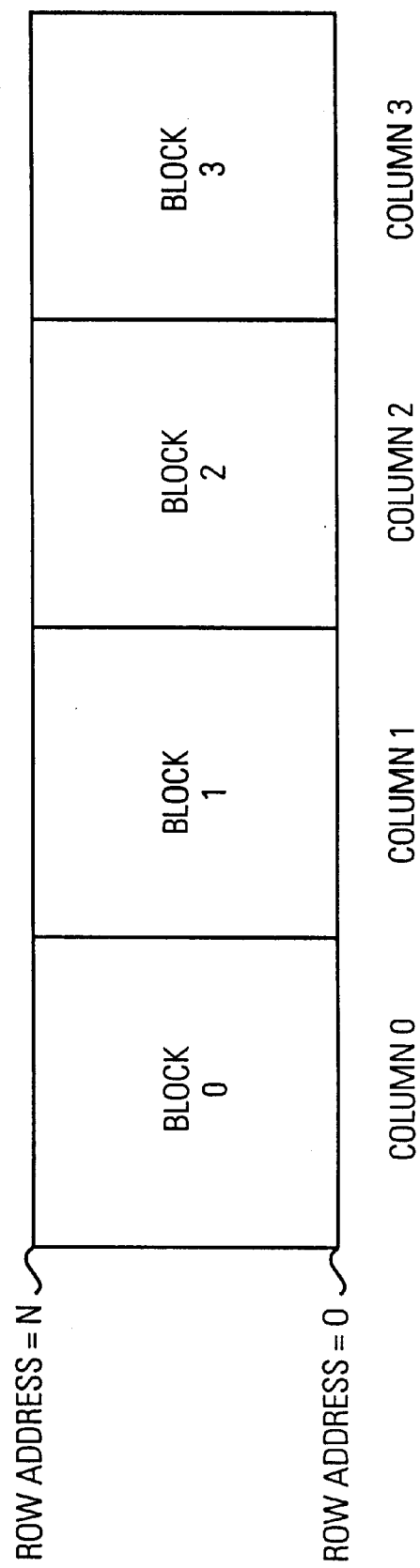
FIG. 1 illustrates a prior art memory configuration.
Figure 2:
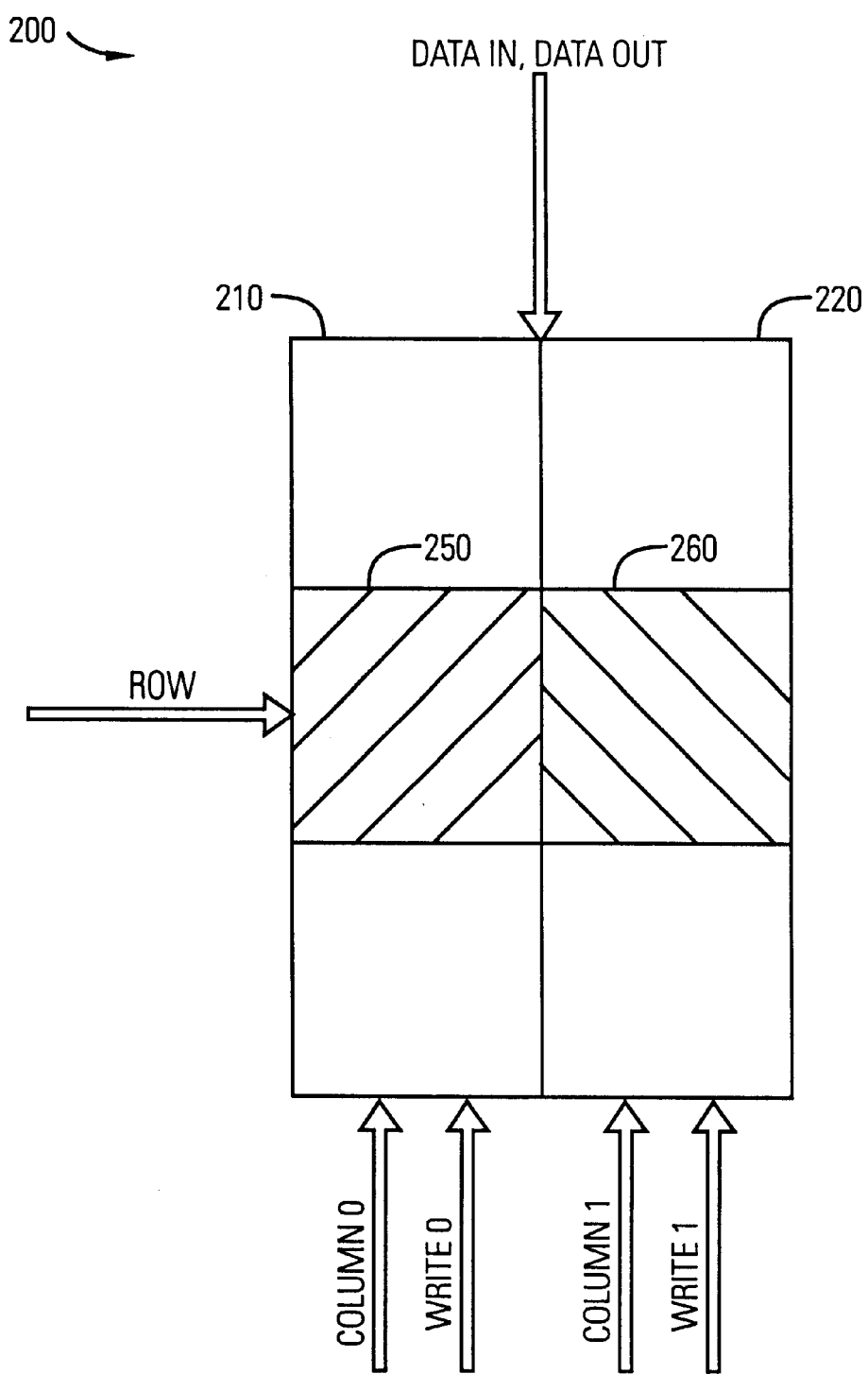
FIG. 2 illustrates a memory architecture that supports mixed-mode accesses according to one embodiment of the present invention can be utilized.

FIG. 2 illustrates a memory architecture 200 that supports mixed-mode accesses according to one embodiment of the present invention can be utilized. The memory architecture 200 includes at least two columns (e.g., a first column 210 and a second column 220). According to the memory architecture 200 of the present invention, the write control signal applies to individual columns.

Specifically, each column receives an individual column signal and an individual write control signal. For example, the first column 210 receives a COLUMN0 signal and a WRITE0 signal. Similarly, the second column 220 receives a COLUMN1 signal and a WRITE1 signal. Since the write control signal is applied to individual columns, a first addressed area 250 can be selected for a read operation while a second addressed area 260 can be selected concurrently for a write operation.

The row and column are selected by decoding address, RAS, and CAS. It is noted that unlike the prior art architecture that requires separate accesses to read and write to different columns in the same row, the architecture of the present invention allows different access types (e.g., one read operation and a write operation) on different columns in the same row in a concurrent fashion. In this regard, data is either written to or read from the addressed area (e.g., area 250 or area 260) based on the condition of the write enable signal (also referred to as a write control signal).

It is important that the minimum access time be equal to the longer of the two access type minimum access times for mixed-mode accesses. For example, consider a situation where a write access is one clock cycle longer than the read access. A first block (block_0) can perform a write, while the second, third and fourth blocks (block_1, block_2, and block_3) perform a read operation. The total access time is the length of time of the write access since the write access takes longer than the read access.

It is noted that this approach yields a timesaving as compared to the prior art that holds off any of the blocks.

The prior art memory architecture assigns each block in the data path a contiguous one-dimensional chunk of memory. In contrast, the memory architecture of the present invention assigns the blocks the same row space, but assigns each block a different column space. One advantage of the memory architecture of the present invention is that the blocks can access the memory concurrently instead of competing for memory access.

Mixed-Mode Memory Access Processing

Figure 3:
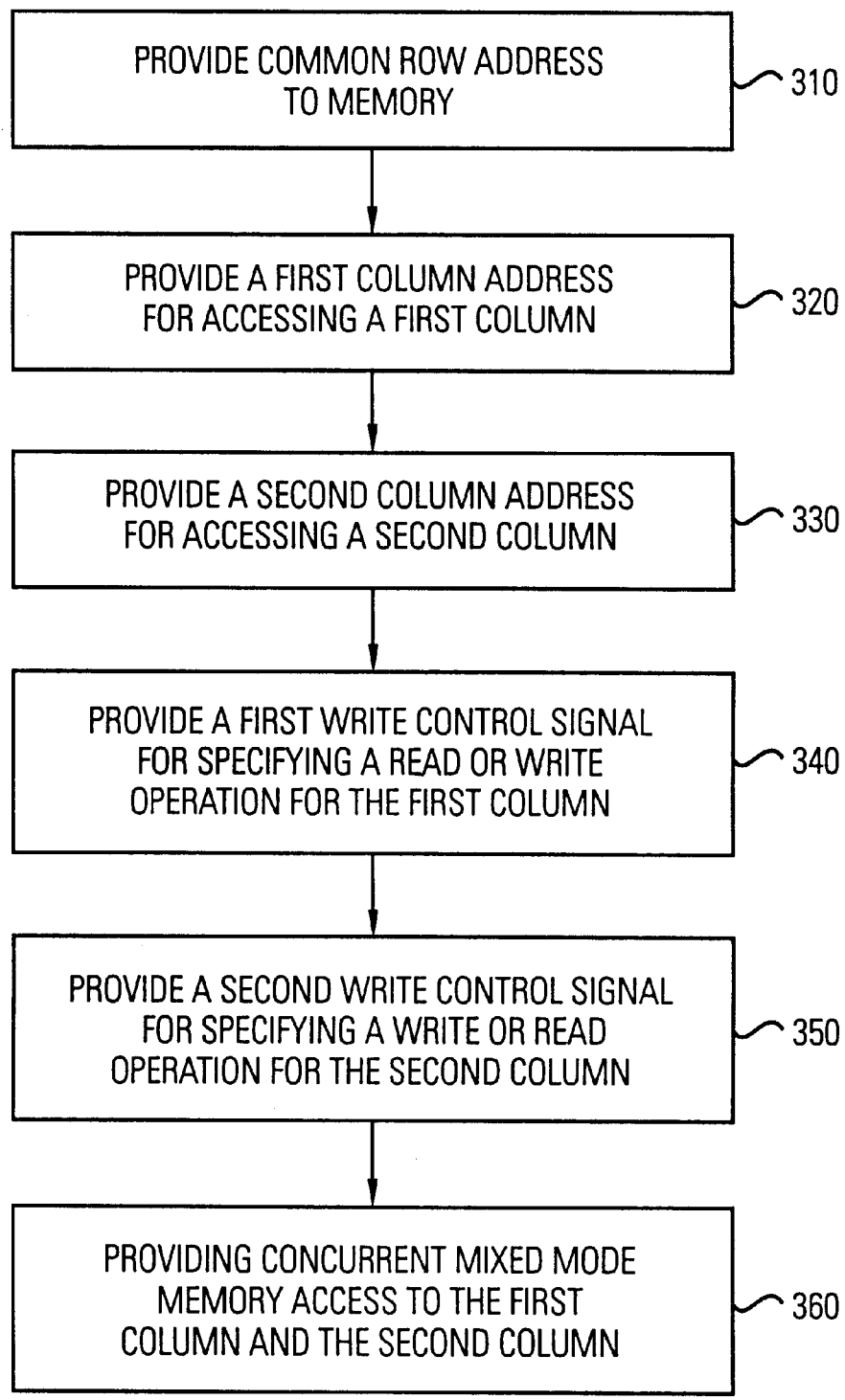
FIG. 3 is a flow chart illustrating the processing step for a mixed-mode memory access in accordance with one embodiment of the present invention.

FIG. 3 is a flow chart illustrating the processing steps for a mixed-mode memory access in accordance with one embodiment of the present invention. In step 310, a common row address is provided to the memory. In step 320, a first column address for accessing a first column is provided to the memory. In step 330, a second column address for accessing a second column is provided to the memory. In step 340, a first write control signal for specifying one of a write access and a read access for the first column is provided to the memory. In step 350, a second write control signal for specifying one of a write access and a read access for the second column is provided to the memory.

In step 360, the memory architecture provides concurrent mixed-mode memory accesses to the first column and the second column. For example, the memory architecture can provide a concurrent read access to the first column and a write access to the second column. Similarly, the memory architecture can provide concurrent write access to the first column and a read access to the second column. It is to be appreciated that the number of columns that are utilized may be varied to suit a particular application. It is further noted that a read access may be granted to any sub-set (may be none of the columns) of these columns and a write access may be granted to any sub-set (may be none of the columns) at the same time.

It is noted that the memory control signals can be generated by a functional block that requires memory access, a memory controller circuit, or a combination thereof.

Exemplary Memory Configuration

Figures 5, 6:
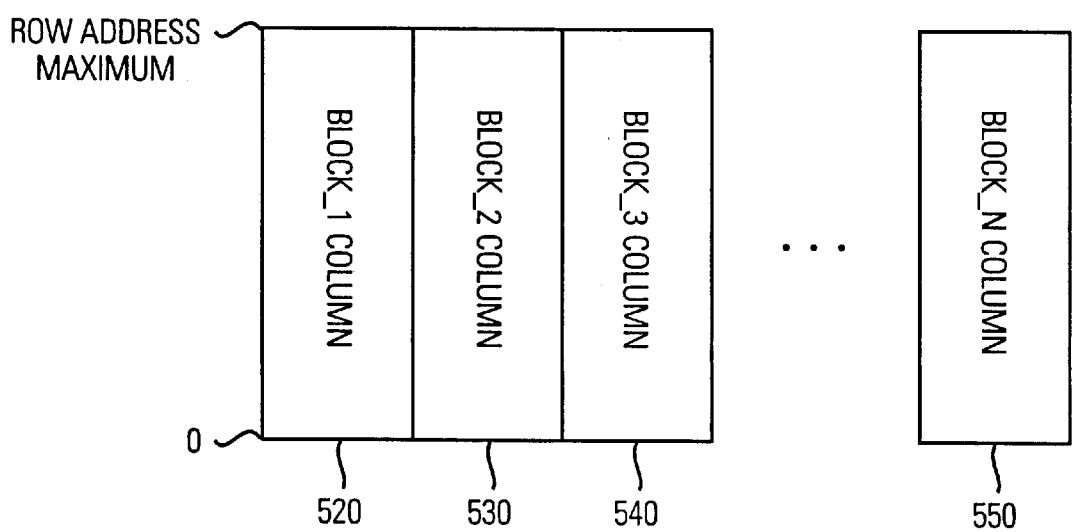
FIG. 5 illustrates an exemplary memory configuration in accordance with one embodiment of the present invention in which different column spaces may be assigned to different functional blocks.
FIG. 6 illustrates an exemplary vertical address space allocation in accordance with one embodiment of the present invention.

FIG. 5 illustrates an exemplary memory configuration 510 in accordance with one embodiment of the present invention in which different column spaces may be assigned to different functional blocks. The memory configuration 510 includes a plurality of column spaces that may be assigned to a particular functional block. For example, a first column space 520 is assigned to a first functional block (BLOCK_1), a second column space 530 is assigned to a second functional block (BLOCK_2), a third column space 540 is assigned to a third functional block (BLOCK_1), and Nth column space 550 is assigned to an Nth functional block (BLOCK_N), etc.

Each functional block may perform one or more functions. These functional blocks require memory access. Examples of functional blocks can be, for example, but is not limited to, a direct memory access (DMA) functional block, a processor, a video processor, a cache controller, decompression blocks, and datapath blocks. The functional blocks can be, for example, disposed in an application specific integrated circuit (ASIC).

It is noted that the memory configuration 510 assigns each functional block the same row space, but a different column space, thereby supporting concurrent access by all the functional blocks to the memory. In this manner, the time penalty, associated with the access-type restriction, is avoided.

Exemplary Vertical Address Space Allocation

FIG. 6 illustrates an exemplary vertical address space allocation 610 in accordance with one embodiment of the present invention. Preferably, additional address locations are employed (e.g., those locations denoted "trash") to facilitate pipelining. It is noted that the overhead for supporting pipelining is minimal.

Embedded Memory

Figure 4:
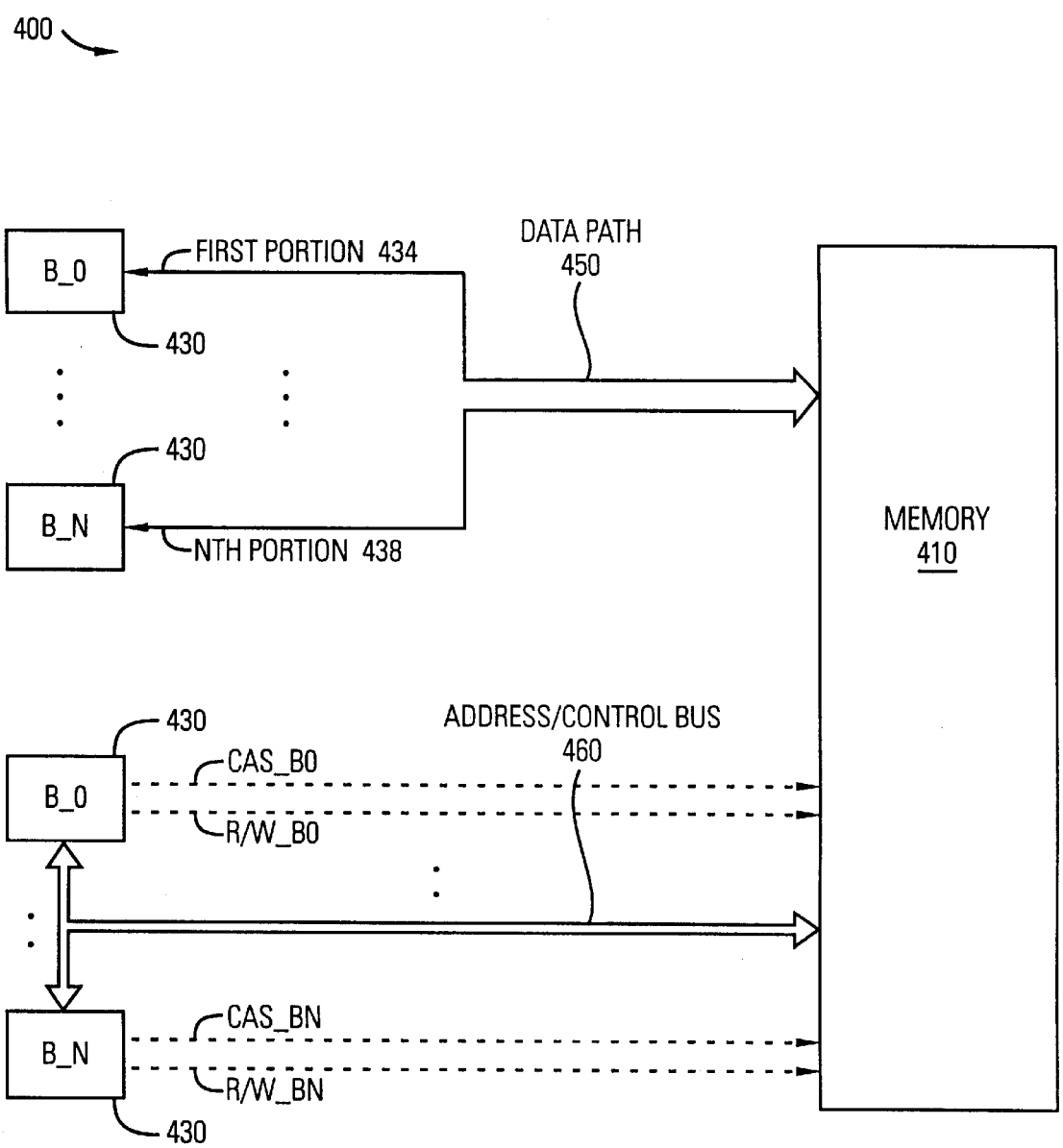
FIG. 4 illustrates the memory of the present invention embedded in an application specific integrated circuit.

FIG. 4 illustrates the memory 410 of the present invention embedded in an application specific integrated circuit 400. The ASIC 400 includes an embedded memory 410 that can be configured in accordance with the teachings of the present invention. The ASIC 400 can have a plurality of functional blocks 430 that require access to the memory 410. A data path 450 is provided to transfer data between the functional blocks 430 and the memory 410. It is noted that the width of the data path is partitioned with each functional block having a portion thereof, such as a first portion 434 and a second portion 438.

An address and control bus 460 is provided for communicating address and other control signals to the memory 410. Each functional block 430 also provides an individual column address strobe (CAS) signal and a write enable or write control signal. For example, CAS_B0 . . . CAS_BN are provided by the functional blocks 430 to the memory 410. Similarly, R/W_B0 . . . R/W_BN are provided by the functional blocks 430 to the memory 410

Further details concerning particular embodiments of an application specific integrated circuit, which can incorporate the memory that supports concurrent read and write operations of different columns in a single row of the present invention, may be found in the following copending patent application, entitled "EMBEDDED MEMORY ACCESS METHOD AND SYSTEM FOR APPLICATION SPECIFIC INTEGRATED CIRCUITS" by inventors Laura Elisabeth Simmons & Chancellor Archie, which is filed concurrently herewith on May 29, 2001 and which is hereby incorporated herein by reference.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. As A method for performing mixed-mode memory accesses for different columns in a common row comprising the steps of:

a) providing a row address for specifying a first row;

b) providing a first column address for accessing a first column in the first row;

c) providing a second column address for accessing a second column in the first row;

d) providing a first write control signal for specifying one of a write access and a read access for the first column;

e) providing a second write control signal for specifying one of a write access and a read access for the second column; and f) providing concurrent mixed-mode memory accesses to the first column in the first row and to the second column in the first row.

2. The method of claim 1 wherein the step of providing concurrent mixed-mode memory accesses to the first column in the first row and to the second column in the first row includes the step of:

f_1) providing concurrent read access to the first column and write access to the second column.

3. The method of claim 1 wherein the step of providing concurrent mixed-mode memory accesses to the first column in the first row and to the second column in the first row includes the step of:

f_1) providing concurrent write access to the first column and read access to the second column.

4. The method of claim 1 wherein the step of providing concurrent mixed-mode memory accesses to the first column in the first row and to the second column in the first row includes the step of:

f_1) using a first portion of a data bus to communicate data from a first block; and f_2) using a second portion of a data bus to communicate data from a second block.

5. The method of claim 4 wherein the first portion communicates data to be written to the memory; and wherein the second portion communicates data to be read from the memory.

6. The method of claim 1 wherein the method is performed in a memory that is embedded in an application specific integrated circuit.

7. A memory comprising:

a) a first column space that is assigned to a first functional block;

b) a second column space that is assigned to a second functional block;

c) a first column address signal for accessing the first column space;

d) a second column address signal for accessing the second column space;

e) a first write signal for specifying one of a write access and a read access for the first column; and f) a second write signal for specifying one of a write access and a read access for the second column;

wherein the memory supports concurrent mixed mode accesses of the first column and the second column of a common row.

8. The memory of claim 7 wherein a common row address is provided to the memory; a first addressed area in the row is subject to a read access; and a second addressed area in the row is concurrently subject to a write access.

9. The memory of claim 7 further comprising:

a) a third column space that is assigned to a third functional block;

b) a third column address signal for accessing the third column space;

c) a third write signal for specifying one or write access and a read access for the third column;

wherein a common row address is provided to the memory;

a first addressed area in the row is subject to a read access;

a second addressed area in the row is concurrently subject to a write access; and a third addressed area in the row is concurrently subject to a write access.

10. The memory of claim 7 wherein a common row address is provided to the memory; a first addressed area in the row is subject to a write access; and a second addressed area in the row is concurrently to a read access.

11. The memory of claim 7 further comprising:

a) a third column space that is assigned to a third functional block;

b) a third column address signal for accessing the third column space;

c) a third write signal for specifying one or write access and a read access for the third column;

wherein a common row address is provided to the memory;

a first addressed area in the row is subject to a write access;

a second addressed area in the row is concurrently subject to a read access; and a third addressed area in the row is concurrently subject to a read access.

12. The memory of claim 7 further comprising:

a) a third column space that is assigned to a third functional block;

b) a third column address signal for accessing the third column space; and c) a third write signal for specifying one of a write access and a read access for the third column.

13. The of claim 12 further comprising:

a) a fourth column space that is assigned to a fourth functional block;

b) a fourth column address signal for accessing the fourth column space; and c) a fourth write signal for specifying one of a write access and a read access for the fourth column.

14. The memory of claim 7 wherein the memory is embedded in an application specific integrated circuit.

* * * * *